United States Patent
Kusko et al.

(10) Patent No.: US 12,174,251 B2
(45) Date of Patent: Dec. 24, 2024

(54) SYSTEM TESTING USING PARTITIONED AND CONTROLLED NOISE

(71) Applicant: International Business Machines Corporation, Armonk, NY (US)

(72) Inventors: Mary P. Kusko, Hopewell Junction, NY (US); Eugene Atwood, Housatonic, MA (US); William V. Huott, Holmes, NY (US); Dustin Feller, Omaha, NE (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 17/487,366

(22) Filed: Sep. 28, 2021

(65) Prior Publication Data

US 2023/0094107 A1   Mar. 30, 2023

(51) Int. Cl.
  *G01R 31/317*   (2006.01)
  *G01R 31/3181*  (2006.01)
  *G01R 31/3183*  (2006.01)
  *G01R 31/3185*  (2006.01)

(52) U.S. Cl.
  CPC .  *G01R 31/31725* (2013.01); *G01R 31/31709* (2013.01); *G01R 31/31813* (2013.01); *G01R 31/3183* (2013.01); *G01R 31/3185* (2013.01)

(58) Field of Classification Search
  None
  See application file for complete search history.

(56) References Cited

U.S. PATENT DOCUMENTS

| | | |
|---|---|---|
| 5,982,189 A | 11/1999 | Motika et al. |
| 6,412,088 B1 | 6/2002 | Patapoutian et al. |
| 6,535,986 B1 | 3/2003 | Rosno et al. |

(Continued)

FOREIGN PATENT DOCUMENTS

| | | |
|---|---|---|
| CN | 100411173 C | 8/2008 |
| DE | 10110315 C2 | 12/2003 |

(Continued)

OTHER PUBLICATIONS

Okayasu Toshiyuki ; Noise Measurement Device and Tester; Publication date: 2010-01-13KR20100005135A; Advantest Corp [JP]; CPC G01R29/26 (Year: 2010).*

(Continued)

*Primary Examiner* — Nasima Monsur
(74) *Attorney, Agent, or Firm* — L. Jeffrey Kelly; Ryan, Mason & Lewis, LLP

(57) ABSTRACT

A system comprises a plurality of regions, wherein ones of the plurality of regions are partitioned from others of the plurality of regions and at least one of the plurality of regions is a region under test. The system comprises at least one noise generator configured to generate noise in at least the region under test, and at least one noise monitor configured to monitor one or more effects of the noise generated in the region under test. The system comprises a test controller configured to: cause the at least one noise generator to generate the noise in at least the region under test; receive information from the at least one noise monitor indicative of the one or more effects of the noise generated in the region under test; and determine one or more conditions based on at least a portion of the received information.

20 Claims, 14 Drawing Sheets

(56) References Cited

U.S. PATENT DOCUMENTS

| | | | |
|---|---|---|---|
| 6,823,293 | B2 | 11/2004 | Chen et al. |
| 7,171,601 | B2* | 1/2007 | Frisch .............. G01R 31/31709 |
| | | | 714/724 |
| 7,472,320 | B2 | 12/2008 | Berndlmaier et al. |
| 7,610,531 | B2 | 10/2009 | Dhong et al. |
| 7,716,546 | B2 | 5/2010 | Le et al. |
| 8,120,378 | B2 | 2/2012 | Swenton et al. |
| 8,405,413 | B2 | 3/2013 | Carpenter et al. |
| 8,461,865 | B2 | 6/2013 | Schlagenhaft |
| 8,468,404 | B1 | 6/2013 | Chickermane et al. |
| 8,854,073 | B2 | 10/2014 | Grosch et al. |
| 8,935,586 | B2 | 1/2015 | Chickanosky et al. |
| 9,373,415 | B2 | 6/2016 | Bose et al. |
| 9,395,782 | B2 | 7/2016 | Berry, Jr. et al. |
| 9,588,177 | B1 | 3/2017 | Atwood et al. |
| 9,712,112 | B1 | 7/2017 | Pedrone et al. |
| 10,018,672 | B2 | 7/2018 | Bhamidipati et al. |
| 2007/0236299 | A1* | 10/2007 | Chun ............. G01R 31/318378 |
| | | | 331/78 |
| 2008/0082887 | A1 | 4/2008 | Dhong et al. |
| 2009/0063921 | A1 | 3/2009 | Aipperspach et al. |
| 2010/0128673 | A1* | 5/2010 | Yamazaki ........... H04W 72/541 |
| | | | 370/328 |
| 2010/0321055 | A1 | 12/2010 | Swenton et al. |
| 2012/0280696 | A1* | 11/2012 | Luo .................. G01R 31/31725 |
| | | | 324/537 |
| 2015/0286770 | A1* | 10/2015 | Morishita ............ H05K 1/0225 |
| | | | 716/112 |
| 2017/0023924 | A1* | 1/2017 | Burns ................ G05B 19/0428 |
| 2018/0180662 | A1* | 6/2018 | Liu .................... G01R 31/2646 |
| 2019/0050515 | A1 | 2/2019 | Su et al. |
| 2021/0111716 | A1 | 4/2021 | Balasubramaniam |

FOREIGN PATENT DOCUMENTS

| | | |
|---|---|---|
| JP | 2001318730 A | 11/2001 |
| JP | 3953459 B2 | 8/2007 |

OTHER PUBLICATIONS

R. Franch et al., "On-chip Timing Uncertainty Measurements on IBM Microprocessors," IEEE International Test Conference, Nov. 2007, 7 pages.

P. Mell et al., "The NIST Definition of Cloud Computing," Recommendations of the National Institute of Standards and Technology, Special Publication 800-145, Sep. 2011, 7 pages.

* cited by examiner

100

200

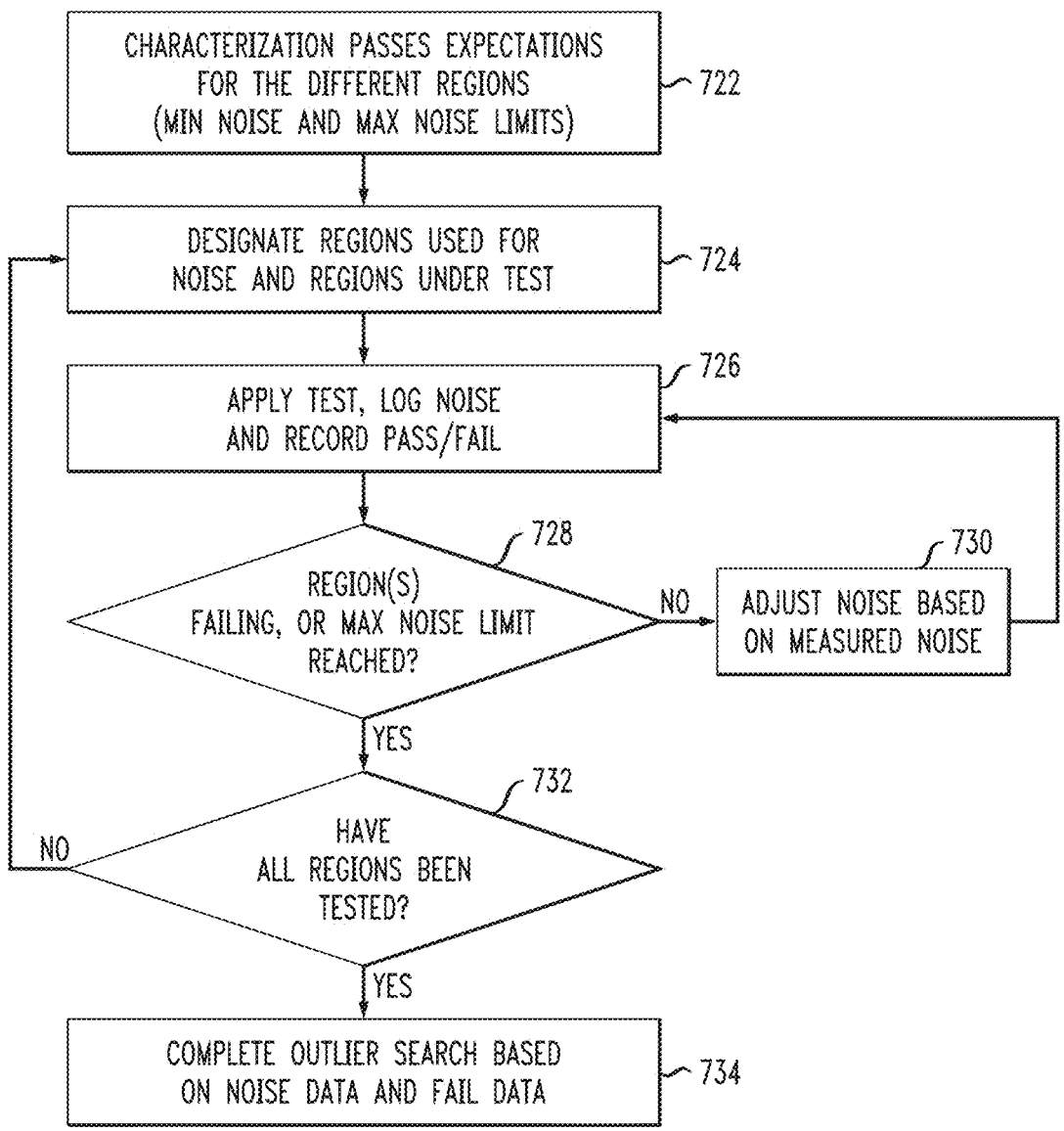

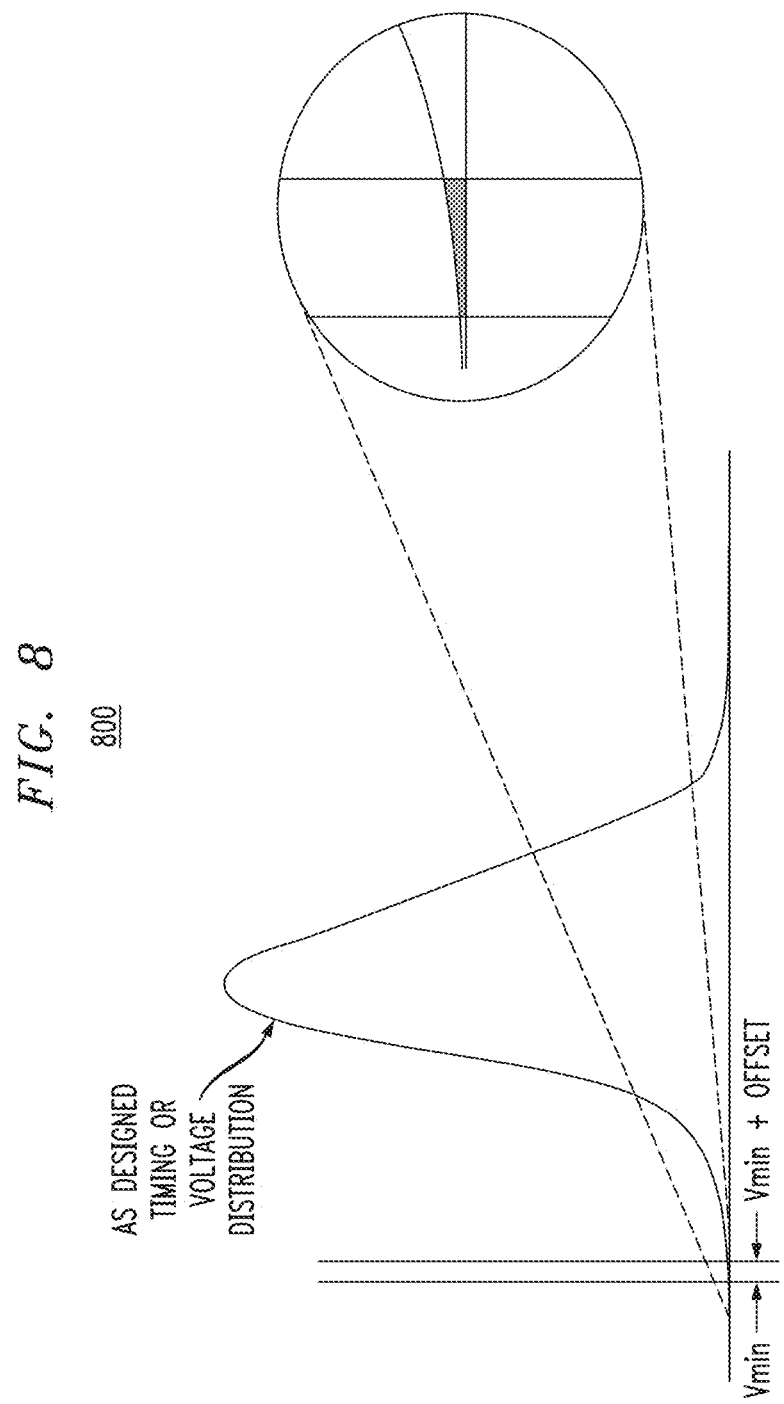

SYSTEM TESTING USING PARTITIONED AND CONTROLLED NOISE

BACKGROUND

Design for test (DFT) is a manufacturing design technique that facilitates testing of an integrated circuit die or chip by adding test circuitry to the chip. It is common DFT practice, for very large scale integrated circuit (VLSI) designs, to use temperature and applied voltage to provide a range of operations which are used to separate good die from bad die. In recent VLSI designs, even sub regions of the die may be deemed bad or identified as needing to be used at certain restricted conditions to be deemed as a good die region. Detection of failures on the operational edge of a chip design are difficult because such failures are close to, or within, a range of operational uncertainty.

SUMMARY

Embodiments provide techniques for testing systems through application of partitioned and controlled noise. While embodiments are well suited for systems comprising integrated circuits partitionable into functional regions, it is to be appreciated that such techniques may be applied to many other types of systems.

In one illustrative embodiment, a system comprises a plurality of regions, wherein ones of the plurality of regions are partitioned from others of the plurality of regions and at least one of the plurality of regions is a region under test. The system further comprises at least one noise generator configured to generate noise in at least the region under test, and at least one noise monitor configured to monitor one or more effects of the noise generated in the region under test. Still further, the system comprises a test controller configured to: cause the at least one noise generator to generate the noise in at least the region under test; receive information from the at least one noise monitor indicative of the one or more effects of the noise generated in the region under test; and determine one or more conditions based on at least a portion of the information received from the at least one noise monitor.

In another illustrative embodiment, a system comprises a plurality of functionally discrete circuits, wherein at least a subset of the plurality of functionally discrete circuits are configurable to function as: a circuit under test; at least one noise generator configured to generate noise in at least the circuit under test; and at least one noise monitor configured to monitor one or more effects of the noise generated in the circuit under test. The system further comprises a test controller operatively coupled to the plurality of functionally discrete circuits and configured to: cause the at least one noise generator to generate the noise in at least the circuit under test; receive information from the at least one noise monitor indicative of the one or more effects of the noise generated in the circuit under test; and determine one or more problems in at least one of a design feature and an operation in the circuit under test based on at least a portion of the information received from the at least one noise monitor.

In yet another illustrative embodiment, a method comprises designating, by a test controller for a first test scenario, at least one region under test from a plurality of regions of a system, wherein ones of the plurality of regions are partitioned from others of the plurality of regions. The method causes, by the test controller, generation of noise in at least the region under test by at least one noise generator. The method then receives, at the test controller, information from at least one noise monitor indicative of one or more effects of the noise generated in the region under test. The method determines, at the test controller, one or more conditions for the first test scenario based on at least a portion of the information received from the at least one noise monitor.

These and other features and advantages of embodiments described herein will become more apparent from the accompanying drawings and the following detailed description.

BRIEF DESCRIPTION OF THE DRAWINGS

FIGS. 7A through 7D depict exemplary flows associated with a testing system environment according to one or more illustrative embodiments.

FIG. 8 depicts a dynamic behavior of a voltage supply network used to introduce margin stress for voltage and timing by a testing system environment according to an illustrative embodiment.

DETAILED DESCRIPTION

As mentioned above in the background section, detection of failures on the operational edge of a chip design distribution is difficult because such failures are close to, or within, a region of operational uncertainty. It is realized herein, through illustrative embodiments, that adding noise to shift the tails of the distribution boundaries can make certain types of failures more observable. The ultimate goal of a manufacturing test is being able to mimic a system environment in order to adequately test and characterize the logic without over testing. It is further realized herein, through illustrative embodiments, that a system's functional behavior includes having other regions on the chip affect the region under test's voltage and temperature noise environment. Note that a region under test in an integrated circuit may also be referred to herein as a circuit under test. It therefore is possible to change a variety of different inputs to adjust the operating range of a chip to highlight areas of logic susceptible to failure at a given edge of operation.

Typically, certain outliers can be found in regular testing, but they have to be far enough away from the normal operational range that they are distinctly observable.

While a test environment may be designed to mimic die power supply load behavior in combination with logic testing or using functional behaviors and thermal transients which mimic the destination use system, illustrative embodiments further provide testing by enhancing local regional perturbations of supply voltages and currents which affect, for example, logic and latch input levels, which can in turn cause changes in timing. The observation range shift achieved via illustrative embodiments makes operational edge cases more easily observable by perturbing inputs to a given region under test.

Accordingly, illustrative embodiments provide techniques useful both for design validation and manufacturing test. Such techniques assist design validation by creating regional aggressor disturbances to uncover previously undetectable or difficult to detect design related issues. Such techniques are also impactful in manufacturing test by creating aggressors for uncovering defects or unacceptable parametric variations based on characterization results.

Figure 1:
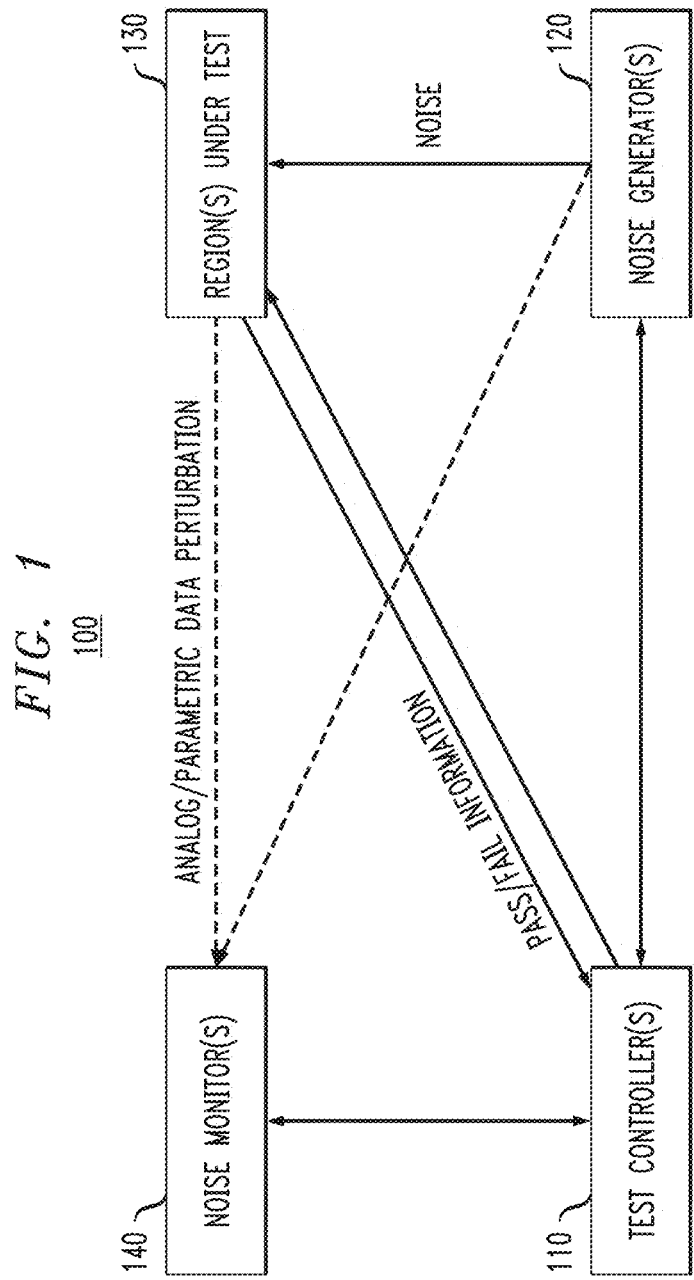
FIG. 1 depicts an overview of a testing system environment according to one or more illustrative embodiments.

FIG. 1 depicts an overview of a testing system environment 100 according to one or more illustrative embodiments. As shown, testing system environment 100 comprises a test controller 110, a noise generator 120, a region under test 130 and a noise monitor 140. Note that there may be more than one of each of test controller 110, noise generator 120, region under test 130 and/or noise monitor 140 in testing system environment 100. Note that when the testing system environment 100 comprises a plurality of functionally discrete circuits as partitioned regions, region under test 130 may be referred to as a circuit under test. Also note that in some DFT-based embodiments, test controller 110, noise generator 120 and noise monitor 140 are resident within the system being tested, e.g., implemented as part of an integrated circuit chip. However, in alternative embodiments, one or more of test controller 110, noise generator 120 and noise monitor 140 can reside outside the system, e.g., implemented off chip.

Testing system environment 100 is configured as a closed loop control system that can be applied to a wide variety of design validation and manufacturing testing scenarios, as well as other applications and for other varied purposes. As an overview, assume that a system such as an integrated circuit chip (e.g., System-on-Chip (SoC), application-specific integrated circuit (ASIC), etc.) is the system being tested and that the chip is partitioned for purposes of testing into a plurality of regions wherein each region is a functionally discrete circuit having one or more functions during real-time operations performed by the chip. Alternative embodiments may have other partitioning and functionality assumptions.

Test controller 110 is configured to generate decisions based on data from noise monitor 140 and pass/fail information from region under test 130, as will be further explained herein. In illustrative embodiments, noise generator 120 can be one or more other regions of the system being tested. A sensor can be used as noise monitor 140 to monitor analog/parametric data perturbation for region under test 130, as well as other regions including the domain used to generate the noise for region under test 130. Test controller 110 sends information to noise monitor 140, as well as receives information to be able to control and adjust noise generator 120 and region under test 130. Noise generator 120 is capable of creating noise that affects region under test 130. Test controller 110 is configured to receive pass/fail information from region under test 130 as well as similar information from the one or more regions used as one or more sources for noise generator 120. Note that solid arrows are intended to depict direct communication or signal connection, while dashed arrows are intended to depict region manipulation (e.g., adjusting power supply, timing, etc.) based on applied noise and effects that are detected.

As will be illustrated and described herein in the context of various non-limiting test scenarios, test controller 110 is able to create and modulate a repeatable amount of noise while also measuring that noise. Test controller 110 can then isolate the point of failure versus the expected range of operation. Advantageously, the system being tested can be calibrated by comparing regions to one another within the system. Further, test controller 110 also can dynamically calibrate and adjust noise monitor 140. In some embodiments, beyond its ability to determine region-to-region failure conditions, test controller 110 is configured to communicate with one or more other similar test controllers in other systems to compare chip-to-chip failure conditions. Still further, after characterization, the system can be compared to an expected otherwise good range of results.

Accordingly, test system environment 100 provides a repeatable methodology to identify outliers that have typically gone undetected or are more difficult to detect, and which is useful as a defect screening tool to isolate defect classes that are sensitive to margining by a noise source (e.g., VDD variation).

Figure 2:
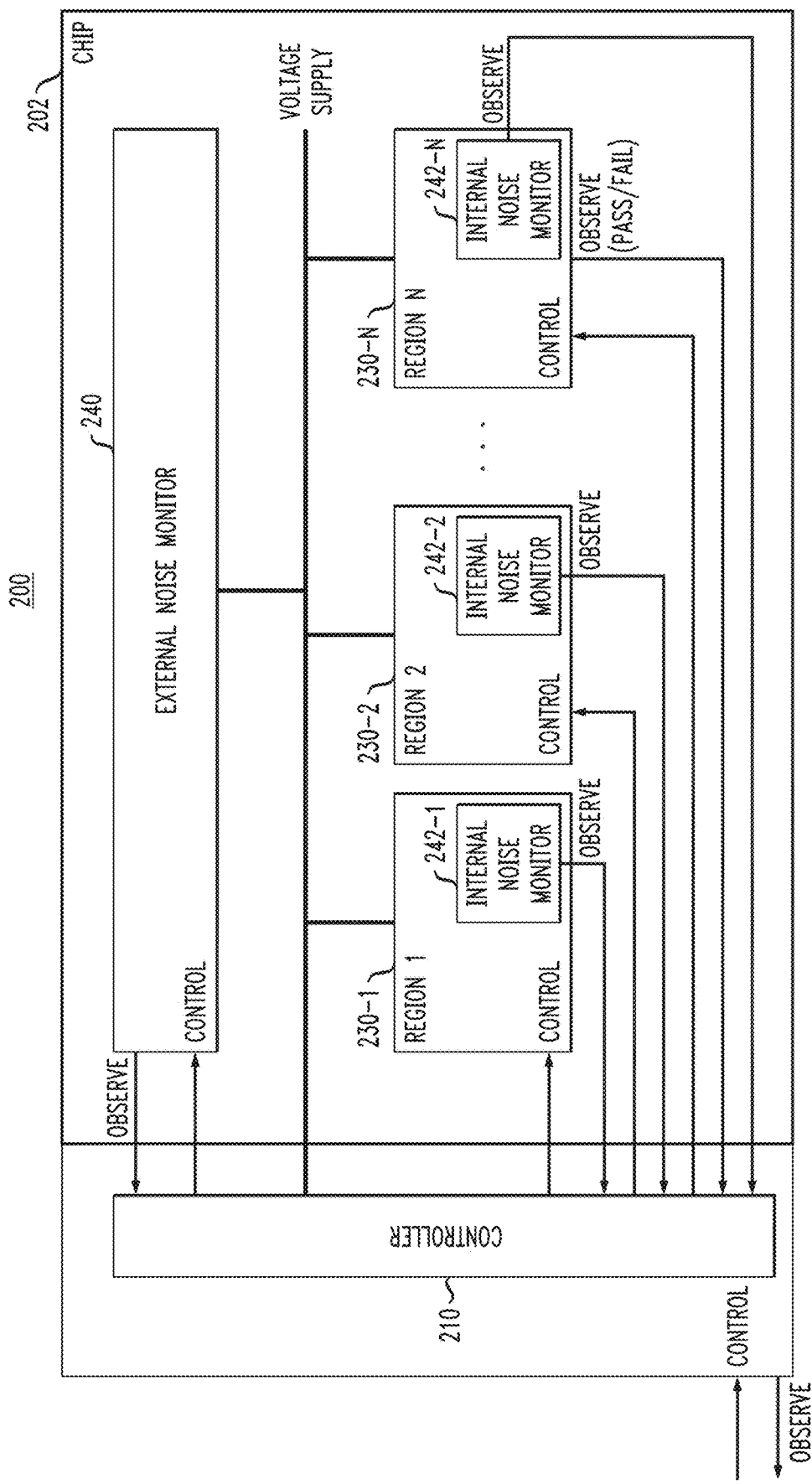
FIG. 2 depicts one exemplary configuration of a testing system environment according to an illustrative embodiment.

FIG. 2 depicts a test configuration 200 of testing system environment 100 of FIG. 1. As shown, the testing system environment is mainly resident on an integrated circuit chip 202, with controller 210 shown as being located off-chip as an external attachment. However, controller 210 can be on-chip, or partially on-chip and partially off-chip, in alternative embodiments. Controller 210 corresponds to test controller 110 of FIG. 1. Regions 230-1, 230-2, ..., 230-N correspond to regions of the chip that can serve either as a region under test 130 of FIG. 1 (i.e., circuit under test) and/or as a noise generator 120 of FIG. 1. That is, in one test scenario, a region can be a region under test and, in another test scenario, the same region can be a noise generator. Test configuration 200 also comprises an external noise monitor 240 and internal noise monitors 242-1, 242-2, ..., 242-N which are respectively part of regions 230-1, 230-2, ..., 230-N. External noise monitor 240 and internal noise monitors 242-1, 242-2, ..., 242-N can be the same or different types of noise (or variation) monitors such as ones configured to monitor region characteristics including, but not limited to, power supply characteristics, timing characteristics, etc., for example, via analog and/or parametric data perturbations sensed or otherwise detected by each respective monitor. Each of regions 230-1, 230-2, ..., 230-N receives one or more control signals from controller 210. The output responses (e.g., one or more observe signals) from each of external noise monitor 240 and internal noise monitors 242-1, 242-2, ..., 242-N are fed to controller 210.

Figure 3:
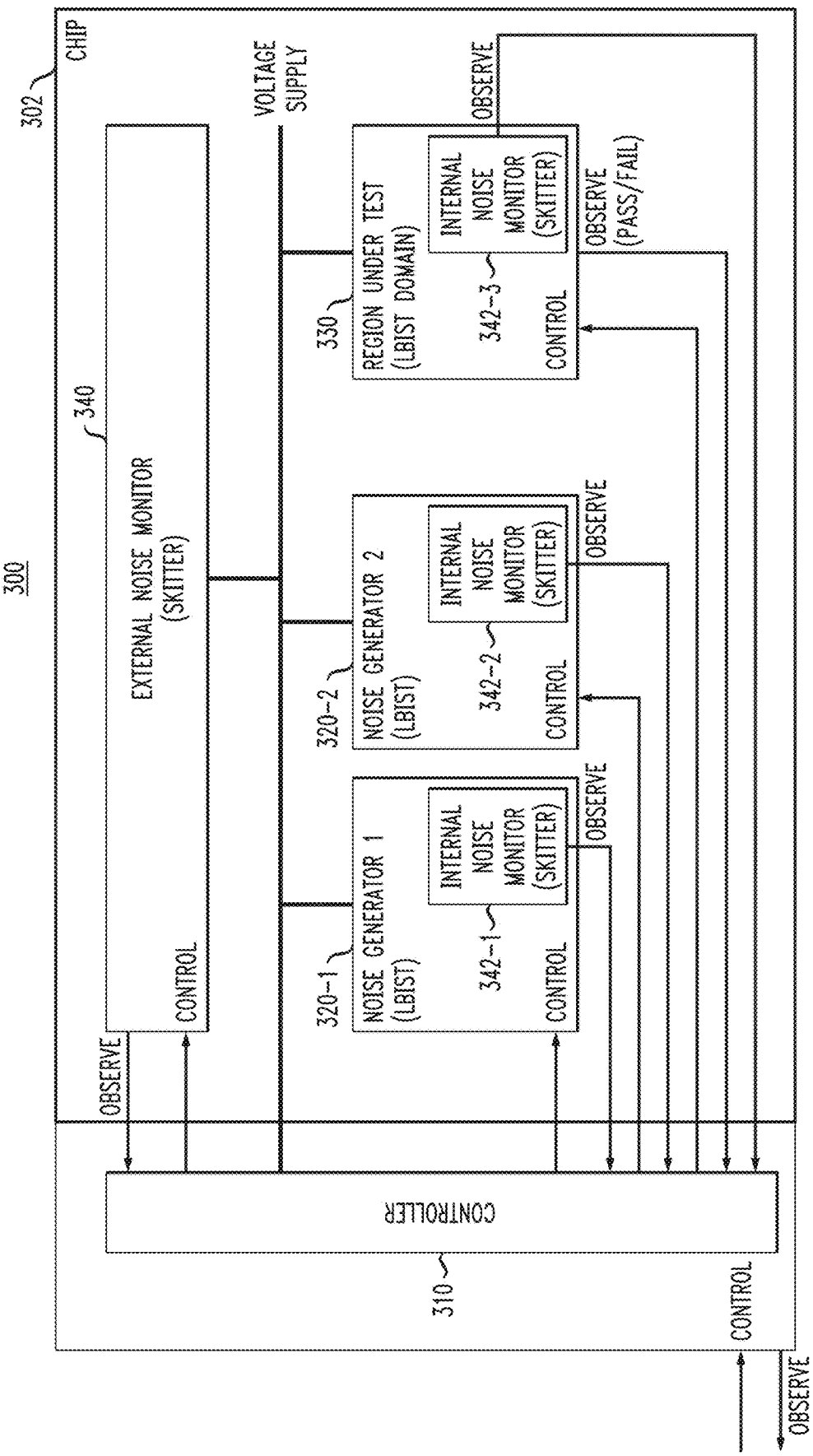
FIG. 3 depicts another exemplary configuration of a testing system environment according to an illustrative embodiment.

FIG. 3 depicts a test configuration 300 of testing system environment 100 of FIG. 1. As shown, the testing system environment is entirely resident on an integrated circuit chip 302, although some components can be located off-chip as described herein. Similar to test configuration 200 of FIG. 2, test configuration 300 comprises a controller 310 corresponding to test controller 110 of FIG. 1. Two regions 320-1 and 320-2 are respectively designated as noise generators 1 and 2, while a region 330 is designated as a region under test. Further, regions 320-1, 320-2 and 330 have their own internal noise monitors 342-1, 342-2 and 342-3, respectively, and test configuration 300 also comprises an external noise monitor 340. In this embodiment, each region 320-1, 320-2 and 330 is configured with logic built-in self-test (LBIST) functionality which may include hardware and/or software built into the region allowing it to test its own operations, as opposed to reliance on external automated test equipment. Similarly, for memory-based regions, an array built-in self-test (ABIST) functionality can be employed. Still further, as shown, each of internal noise monitors 342-1, 342-2, 342-3, and external noise monitor 340 may be configured with a SKITTER monitor. SKITTER is an on-chip measurement functionality for detecting and quantifying signal skew and jitter (the name deriving from SKew-jITTER) and can monitor timing variation due to changes in power supply (e.g., quantify time dependent voltage drop), i.e., analog and/or parametric perturbations.

More particularly, test configuration 300 enables pass/fail information from region under test 330 to be sent back to controller 310. Noise is able to be observed for region under test 330 internally (by internal noise monitor 342-3) or externally (by external noise monitor 340 and/or internal noise monitors 342-1 and 342-2). Advantageously, this allows for a comparison of the noise inside and outside of region under test 330. Based on results from one or more of noise monitors 340, 342-1, 342-2 and/or 342-3 and pass/fail results from region under test 330, controller 310 adjusts the noise generators of regions 320-1 and 320-2 and the application of the test (LBIST) in region under test 330. That is, the noise can be adjusted through the point of failure for characterization, e.g., using a free running LBIST scan mode, adjusting LBIST weights, changing the scan rate, staggering clocks, manipulating features such as, but not limited to, sector buffer strength, duty cycle of clock grid, and data waiting.

It is to be appreciated that LBIST and ABIST are methods for testing circuitry which have regionality characteristics. These methods have controls which can be manipulated to produce noise-like behavior. One example is noise caused by rapid power supply load changes. These load changes propagate to other regions through the power supply network. Another example is using LBIST or ABIST to cause local thermal stresses.

Figure 4:
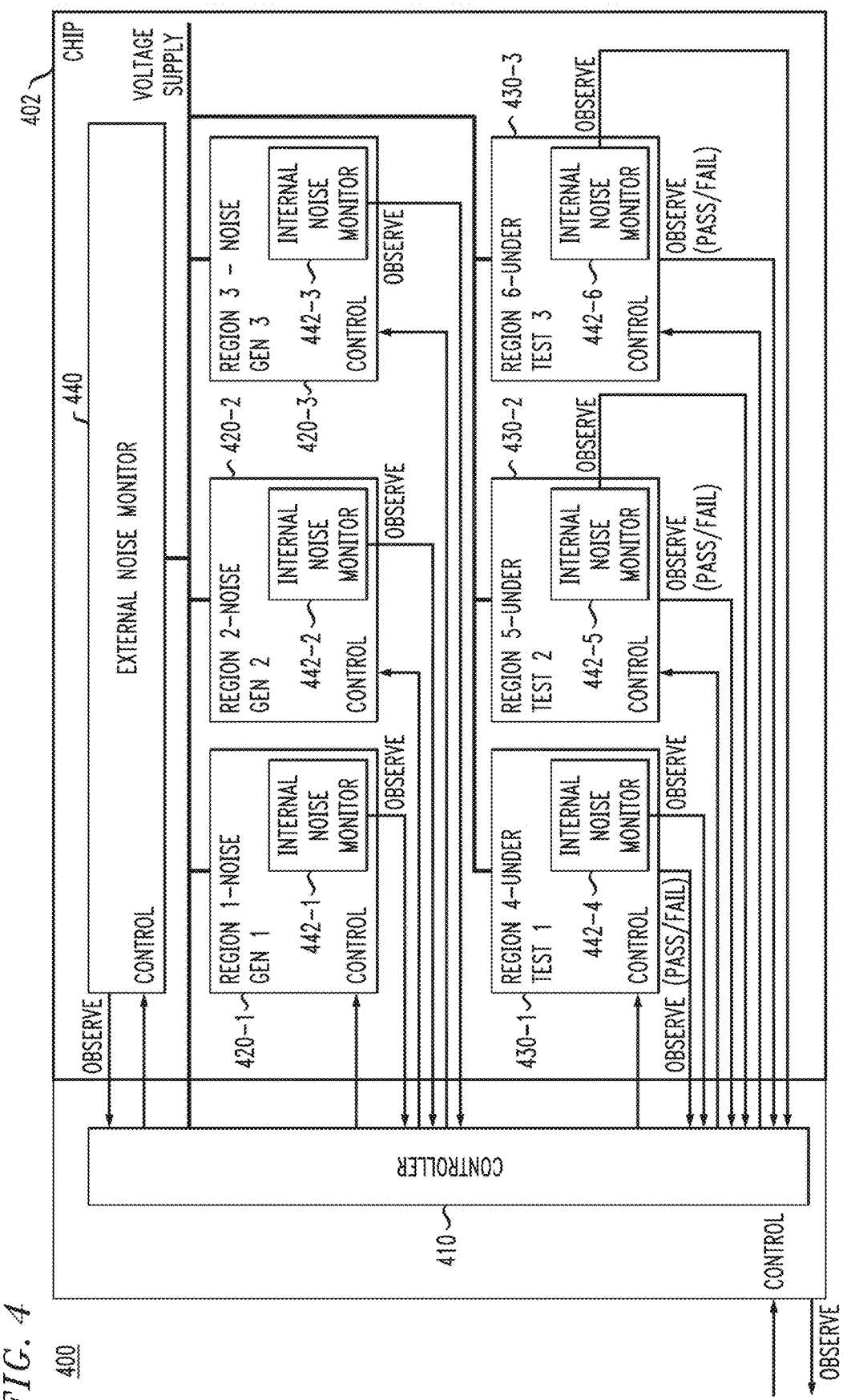
FIG. 4 depicts yet another exemplary configuration of a testing system environment according to an illustrative embodiment.

FIG. 4 depicts a test configuration 400 of testing system environment 100 of FIG. 1 involving an integrated circuit chip 402. Test configuration 400 comprises controller 410, multiple noise generators 420-1 (region 1), 420-2 (region 2) and 420-3 (region 3), multiple regions under test 430-1 (region 4), 430-2 (region 5) and 430-3 (region 6), and an external noise monitor 440. Similar to the above-described test configurations 200 and 300, each of regions 1-6 in test configuration 400 has its own respective internal noise monitor, i.e., internal noise monitors 442-1 (region 1), 442-2 (region 2), 442-3 (region 3), 442-4 (region 4), 442-5 (region 5) and 442-6 (region 6). In this non-limiting example configuration, as shown, controller 410 is located off-chip, while the other components are located on-chip. The noise generated from multiple noise generators 420-1, 420-2 and 420-3 is applied to multiple regions under test 430-1, 430-2 and 430-3. The detection of outliers in regions under test 430-1, 430-2 and 430-3 by controller 410 can be accomplished as explained above. Also, as explained above, any noise generator can also be selected to be a region under test and, as well, a region under test can be used as a noise generator.

Figure 5:
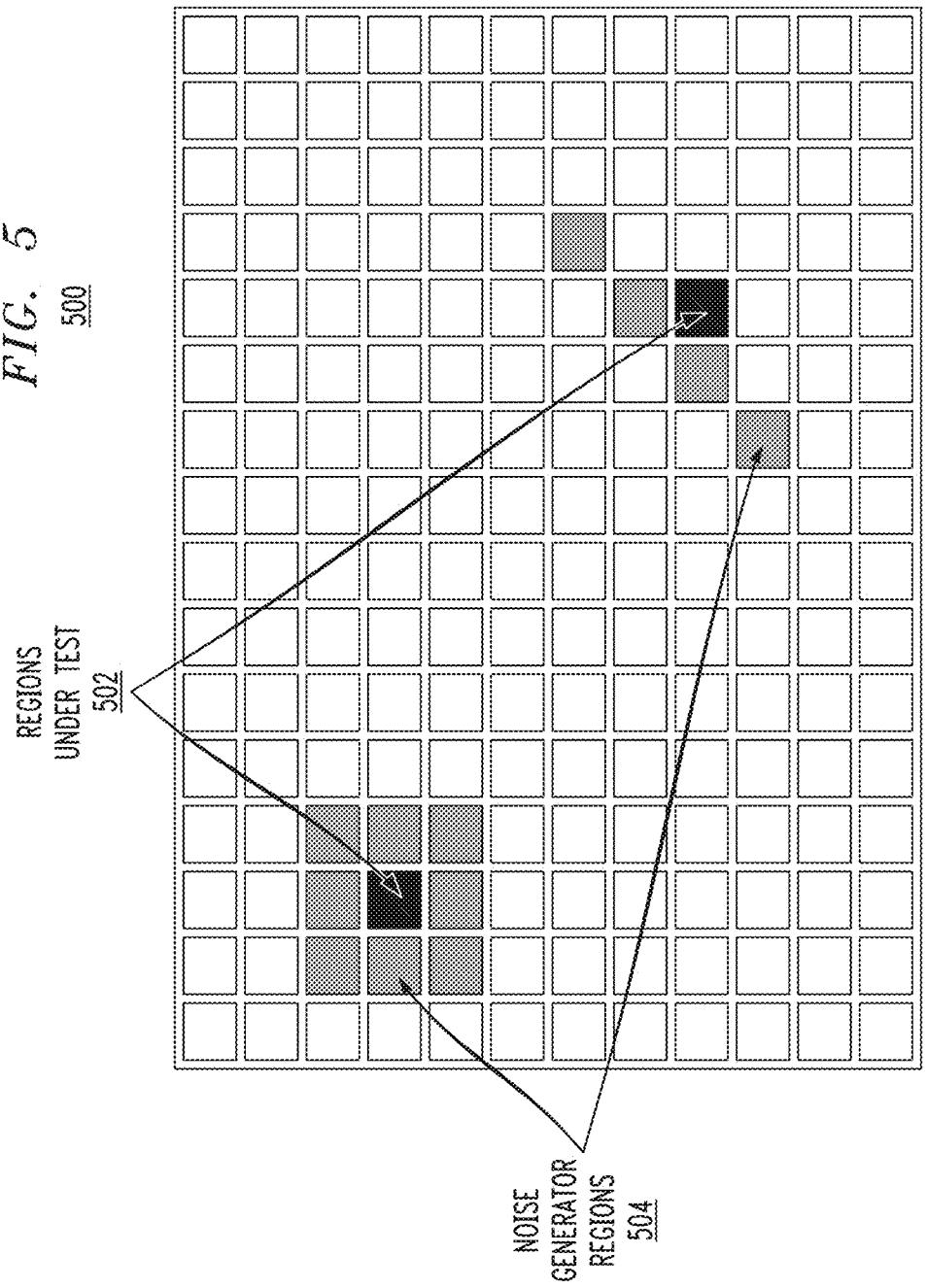
FIG. 5 depicts one exemplary configuration of noise generator aggressors and regions under test in a testing system environment according to an illustrative embodiment.
Figure 6:
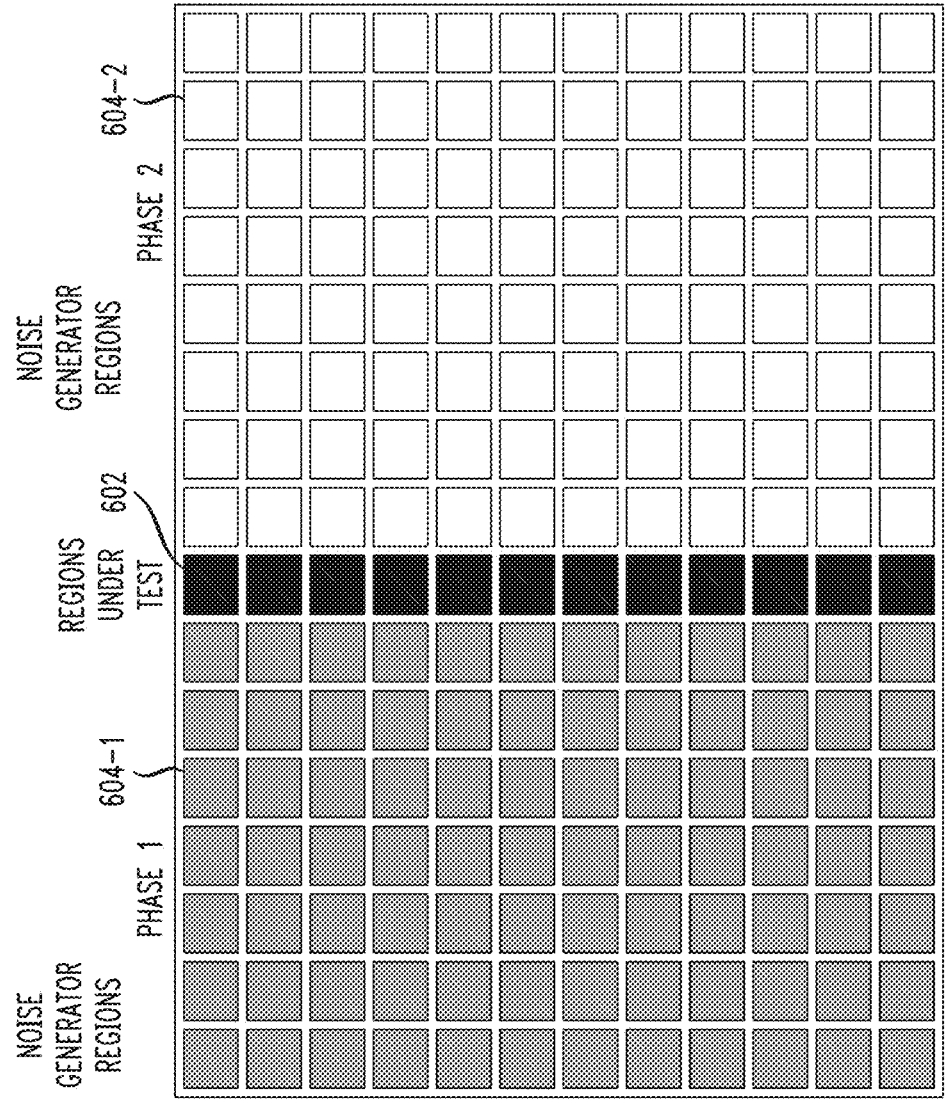
FIG. 6 depicts another exemplary configuration of noise generator aggressors and regions under test in a testing system environment according to an illustrative embodiment.

Turning now to FIGS. 5 and 6, exemplary configurations 500 and 600 are respectively depicted of noise generator aggressors and regions under test in a testing system environment according to an illustrative embodiment. It is to be understood that the views shown in these figures are two-dimensional overhead illustrations of integrated circuit chips upon which testing system environments according to illustrative embodiments are implemented. More particularly, each square in each illustration is intended to represent a partitioned region (e.g., a functionally discrete circuit) on the chip and where it physically resides in relation to other regions on the chip.

Thus, in test configuration 500 of FIG. 5, two regions under test 502 (one in upper left and one in lower right) are shaded in dark gray while respective surrounding/proximate noise generator regions 504 are shaded in light gray. In test configuration 600, a set of regions under test 602 (in the middle of the chip) are shaded in dark gray while a first set of noise generator regions 604-1 (to left of set of regions under test 602) is shaded in medium grey and a second set of noise generator regions 604-2 (to right of set of regions under test 602) is shaded in light gray. In a test scenario, the first set of noise generators regions 604-1 are part of a first phase (phase 1) of the test scenario wherein the regions in the first set apply or otherwise introduce noise to the set of regions under test 602. Then, the second set of noise generators regions 604-2 are part of a second phase (phase 2) of the test scenario wherein the regions in the second set apply or otherwise introduce noise to the set of regions under test 602. Alternative test scenarios can be implemented with different sequences of the application of noise from first and second sets of noise generator regions 604-1 and 604-2, or from one or more individual noise generator regions within first and second sets of noise generator regions 604-1 and 604-2.

In both test configurations 500 and 600, it is assumed that a test controller (not expressly shown, e.g., test controller 110 or one of controllers 210, 310 and 410) is programmed with executable program code to send one or more control signals to the appropriate noise generator regions (504 or 604-1 and 604-2) that surround or are otherwise proximate to region(s) under test (502 or 602) and receive one or more observe signals from noise monitors (not expressly shown, e.g., external and/or internal to the regions) in order to determine potential and/or existing issues (defects, outliers, etc.) in the design or operation of the chip.

FIGS. 7A through 7D depict exemplary flows associated with a testing system environment according to one or more illustrative embodiments. It is to be appreciated that these flows can be performed in accordance with testing system environment 100 of FIG. 1 and may include test configurations including, but not limited to, those described above in the context of FIGS. 2-6. Test controller 110 is used to manage the testing system environment. Thus, in illustrative embodiments, the steps of FIGS. 7A through 7D can be performed or otherwise caused by test controller 110.

Figure 7A:
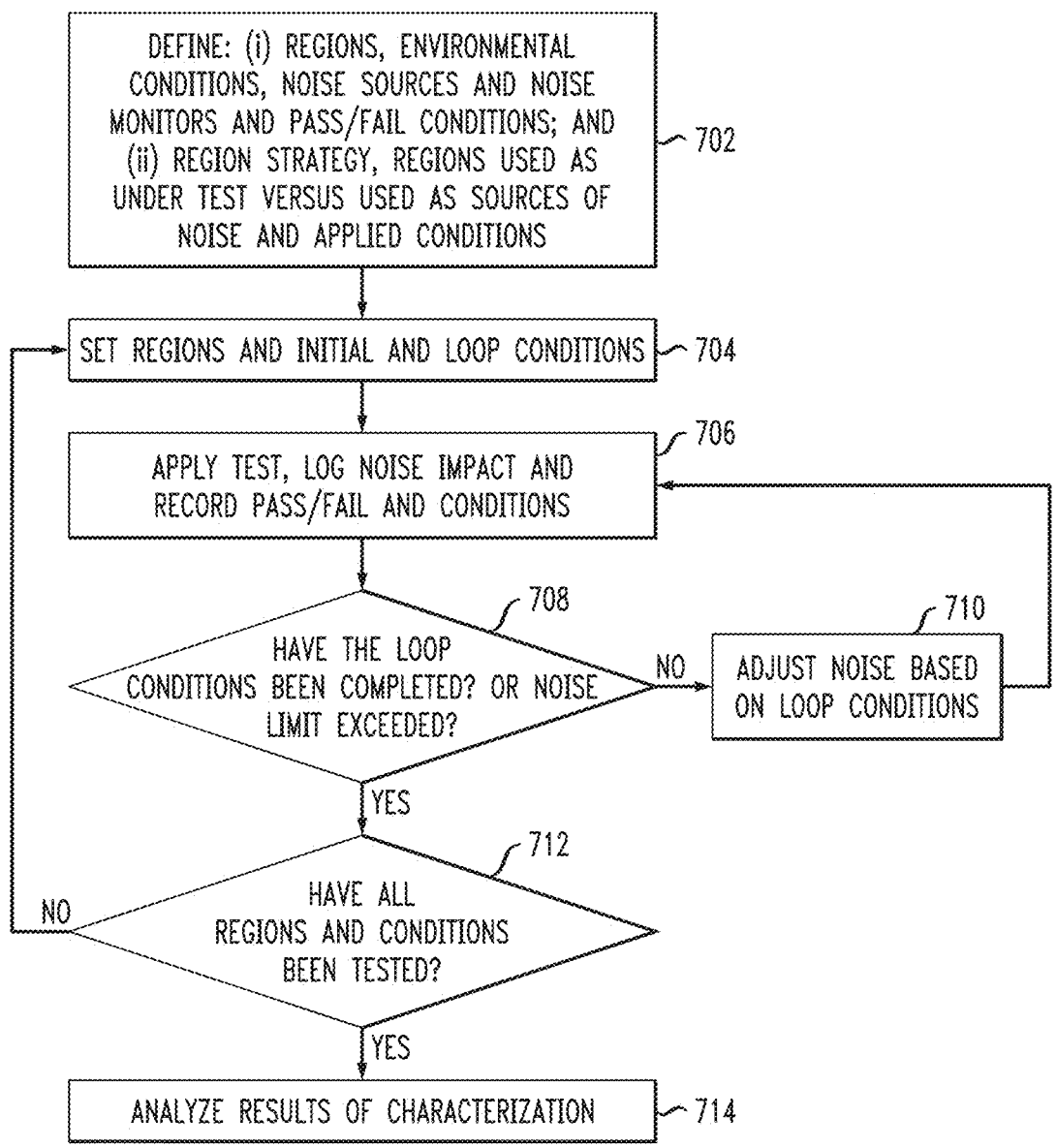

More particularly, FIG. 7A shows a flow 700 including the following steps. Step 702 defines: (i) regions, environmental conditions, noise generators, noise monitors, and pass/fail conditions; and (ii) region strategy, regions used as under test versus used as sources of noise and applied conditions. Step 704 sets regions and initial and loop conditions. It is to be appreciated that regions are identified in step 702 based on knowledge of the designs partitioning and controls. Setting the regions means selecting one or more regions to be under test and one or more regions to be used for noise generation. There is art in making such selections based on design knowledge, such as, by way of example, regions on the boundary of the power supply grid may be more subject to voltage droop or central regions more subject to higher thermal conditions.

Further, it is to be understood that flow 700 is describing a 'search' where many different regionalities and noise conditions are tried in order to make observable the effect of perturbations caused by noise generation. The loop in flow 700 runs through a set of different conditions which may include circuit test weighting and external supply and temperature conditions. Thus, for example, initial conditions would have the region under test passing, but near an environmental boundary (e.g., temperature, supply voltage, frequency, etc.).

Step 706 applies the test, logs the noise impact and records pass/fail conditions.

Step 708 determines whether or not loop conditions have been completed or noise limit conditions have been exceeded. If loop conditions have not yet been completed and noise limit conditions have not been exceeded, step 710 adjusts noise based on remaining loop conditions and the flow 700 then iterates back to step 706. In an LBIST implementation, this can include adjusting control bits, clock speed, weights, etc. to affect voltages and temperatures in the system. If loop conditions have been completed or noise limit conditions have been exceeded, step 712 determines whether or not all regions and conditions have been tested. If step 712 is affirmative, then step 714 analyzes the results of this particular test scenario (characterization). If step 712 is negative, the flow 700 iterates back to step 704.

FIG. 7B shows a flow 720 including the following steps. Step 722 assumes that a final flow and conditions have been determined during a discovery or learning characterization (e.g., as performed in flow 700 of FIG. 7A) and that the characterization is satisfactory for a minimum and maximum range of noise.

Step 724 designates regions used for noise and regions under test. Step 726 applies the test, logs the noise impact and records pass/fail conditions.

Step 728 determines whether or not a region has failed or noise limits have been reached. If step 728 is negative, step 730 adjusts noise based on measured noise and the flow 720 then iterates back to step 726. Again, in an LBIST implementation, this can include adjusting control bits, clock speed, weights, etc. to affect voltages and temperatures in the system. If step 728 is affirmative, step 732 determines whether or not all regions have been tested. If step 732 is affirmative, then step 734 completes the outlier search based on the acquired noise data and fail data. If step 732 is negative, the flow 720 iterates back to step 724.

Figure 7C:
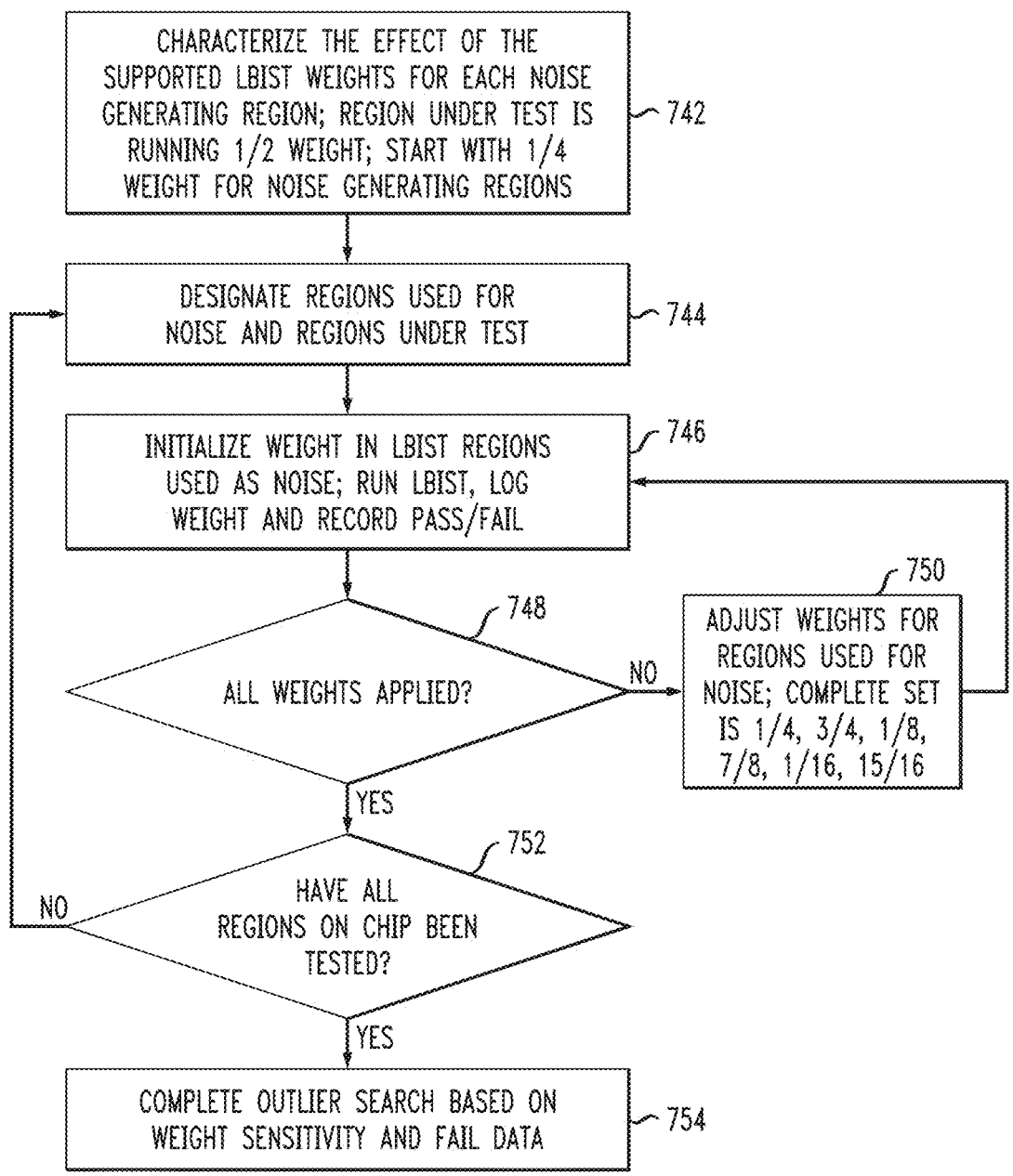

FIG. 7C shows a flow 740 including the following steps. Note that test controller 110 can adjust the noise based on the noise monitor and thus, in this example, a complete set of experiments are run to understand performance and expectations. Step 742 characterizes the effect of the supported LBIST weights for each noise generation region, and region under test is running ½ weight and starts with ¼ weight for noise generation regions.

Step 744 designates regions used for noise and regions under test. Step 746 initializes a weight in LBIST regions used as noise, runs LBIST, logs the weight and records pass/fail. Step 748 determines whether or not all weights have been applied. If step 748 is negative, step 750 adjusts weights for regions used for noise (i.e., note that the complete set of LBIST weights is ¼, ¾, ⅛, ⅞, 1/16, 15/16). The flow 740 iterates back to step 746. If step 748 is affirmative, step 752 determines whether or not all regions have been tested. If step 752 is affirmative, then step 754 completes the outlier search based on weight sensitivity and fail data. If step 752 is negative, the flow 740 iterates back to step 744.

Figure 7D:
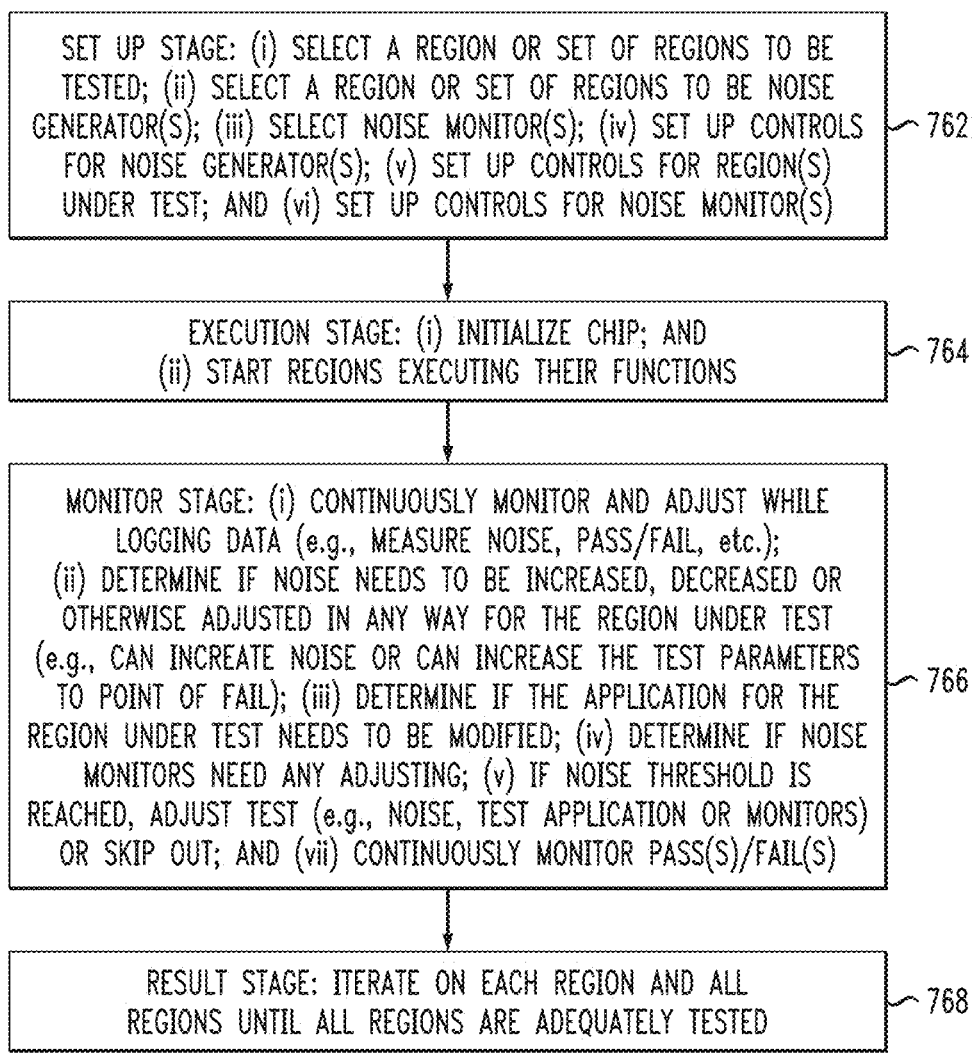

FIG. 7D summarizes the flows of FIGS. 7A through 7C and provides an overall testing system methodology 760 performed by test controller 110 comprising a set up stage, an execution stage, a monitor stage and a results stage. Again, as with flows 700, 720 and 740, when it is described below that test controller 110 performs an action, it is also intended to also refer to a scenario where test controller 110 causes another component in the testing system environment to perform the action.

Step 762 illustrates the set up stage wherein test controller 110: (i) selects a region or set of regions to be tested; (ii) selects a region or set of regions to be noise generator(s); (iii) selects noise monitor(s); (iv) sets up controls for noise generator(s); (v) sets up controls for region(s) under test; and (vi) sets up controls for noise monitor(s).

Step 764 illustrates the execution stage wherein test controller 110: (i) initializes chip; and (i) starts regions executing their functions.

Step 766 illustrates the monitor stage wherein test controller 110: (i) continuously monitors and adjusts while logging data (e.g., measure noise, pass/fail, etc.); (ii) determines if noise needs to be increased, decreased or otherwise adjusted in any way for the region under test (e.g., can increase noise or can increase the test parameters to point of fail); (iii) determines if the application for the region under test needs to be modified; (iv) determines if noise monitors need any adjusting; (v) if noise threshold is reached, adjusts test (e.g., noise, test application or monitors) or skip out; and (vii) continuously monitors pass/fail conditions.

Step 768 illustrates the results stage wherein test controller 110 iterates on each region and all regions until all regions are adequately tested (discovery characterization applied to 'large' sample; finally manufacturing test application; selected and verified 'weak' links are made observable using, typically, a subset of the characterization flow).

FIG. 8 depicts a graph 800 of dynamic behavior of a voltage supply network used to introduce margin stress for voltage and timing by a testing system environment according to an illustrative embodiment. More particularly, as shown, Vmin as designed and/or characterized is used as a setpoint to verify operation of the region under test with the expected design margin. The goal of introducing a perturbation is to enable operation of the region under test at its minimum voltage or at a point near its minimum where the introduction of noise exacerbates a timing or voltage condition which results in a useful test observation. It is these types of observations, as well as others, that testing system environments according to illustrative embodiments are configured to make.

Accordingly, as illustratively explained herein, embodiments aggravate the region under test in a unique way by applying non-standard stimulus to an otherwise working chip to highlight timing and voltage sensitivities. This provides the ability to identify unique failures (e.g., coupled VDD) and, in general, to accurately detect and isolate failures (especially noise sensitive faults). Typically, these are un-modelled defects that are difficult/impossible to detect and difficult/impossible to isolate in existing testing system environments. Illustrative embodiments advantageously provide a test controller that learns what noise perturbation aggravates the failure by isolating what noise perturbs the failure.

The techniques depicted in FIGS. 1-8 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIGS. 1-8 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Additionally, illustrative embodiments can make use of software running on a computer or workstation. For example, testing system environment 100 can be coupled to such a computer or workstation, or parts of testing system environment 100 (e.g., test controller 110) can be implemented as part of such a computer or workstation.

Figure 9:
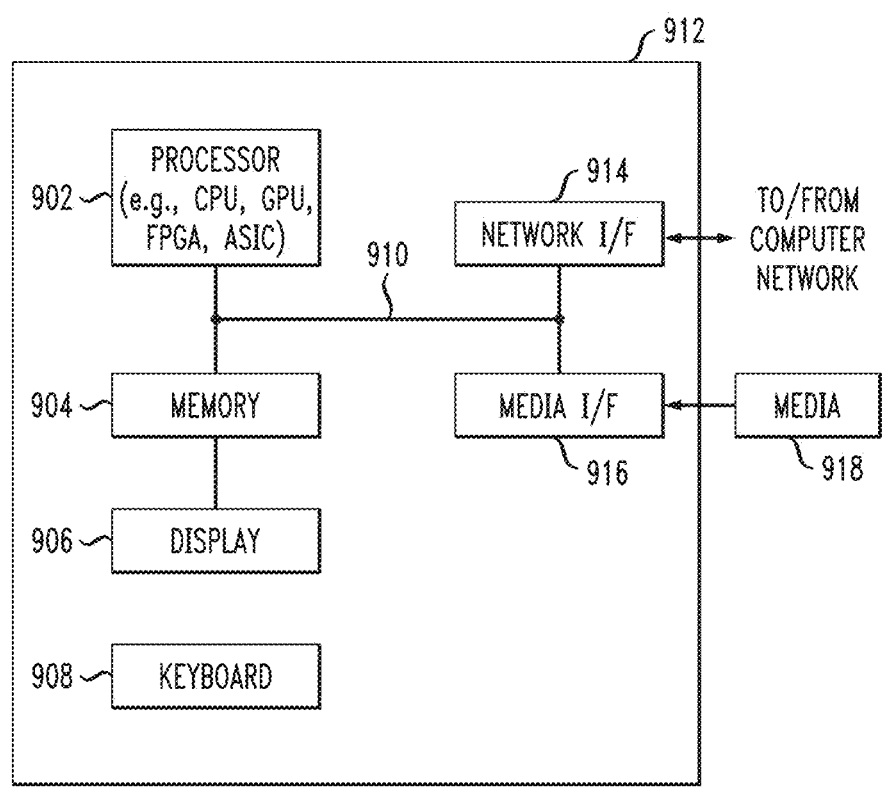
FIG. 9 depicts an exemplary processor system according to an illustrative embodiment.

With reference to FIG. 9, such an implementation might employ, for example, a processor 902, a memory 904, and an input/output interface formed, for example, by a display 906 and a keyboard 908. The term "processor" as used herein is intended to include any processing device, such as, for example, one that includes a multi-core CPU, GPU, FPGA and/or other forms of processing circuitry such as one or more ASICs. Further, the term "processor" may refer to more than one individual processor. The term "memory" is intended to include memory associated with a processor (e.g., CPU, GPU, FPGA, ASIC, etc.) such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 902, memory 904, and input/output interface such as display 906 and keyboard 908 can be interconnected, for example, via bus 910 as part of a data processing unit 912. Suitable interconnections, for example via bus 910, can also be provided to a network interface 914, such as a network card, which can be provided to interface with a computer network, and to a media interface 916, such as a diskette or CD-ROM drive, which can be provided to interface with media 918.

Accordingly, computer software including instructions or code for performing the methodologies of embodiments of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 902 coupled directly or indirectly to memory elements 904 through a system bus 910. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 908, displays 906, pointing devices, and the like) can be coupled to the system either directly (such as via bus 910) or through intervening I/O controllers (omitted for clarity).

Network adapters such as network interface 914 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 912 as shown in FIG. 9) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 902. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICs), functional circuitry, an appropriately programmed digital computer with associated memory, and the like. Given the teachings of the invention provided herein, one of ordinary skill in the related art will be able to contemplate other implementations of the components of the invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 10:
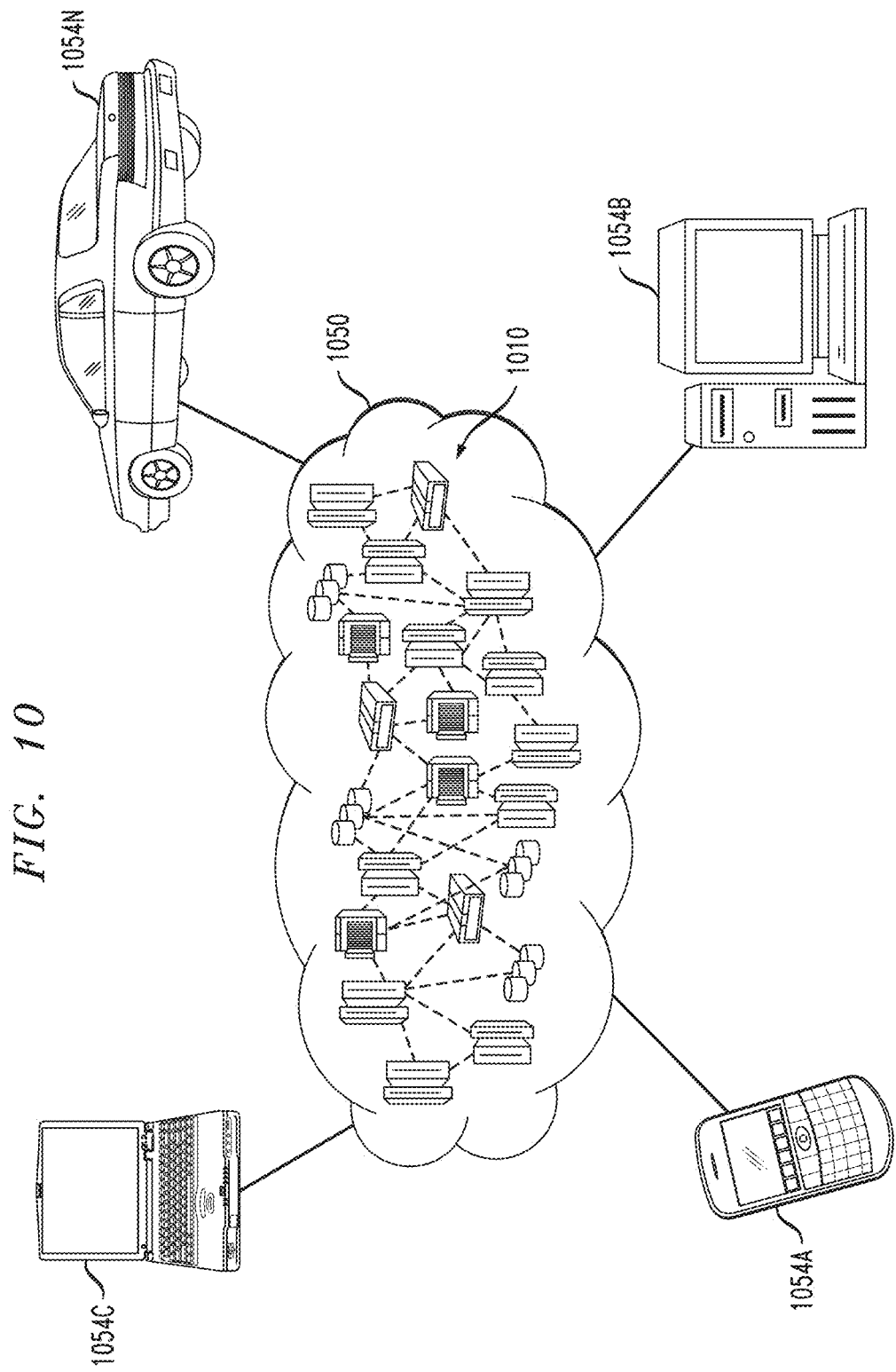
FIG. 10 depicts a cloud computing environment according to an illustrative embodiment.

Referring now to FIG. 10, illustrative cloud computing environment 1050 is depicted. As shown, cloud computing environment 1050 includes one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N may communicate. Cloud computing nodes 1010 may communicate with one another. They may be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-N shown in FIG. 10 are intended to be illustrative only and that cloud computing nodes 1010 and cloud computing environment 1050 can communicate with any type of computerized device over any type of network and/or network addressable connection (e.g., using a web browser).

Figure 11:
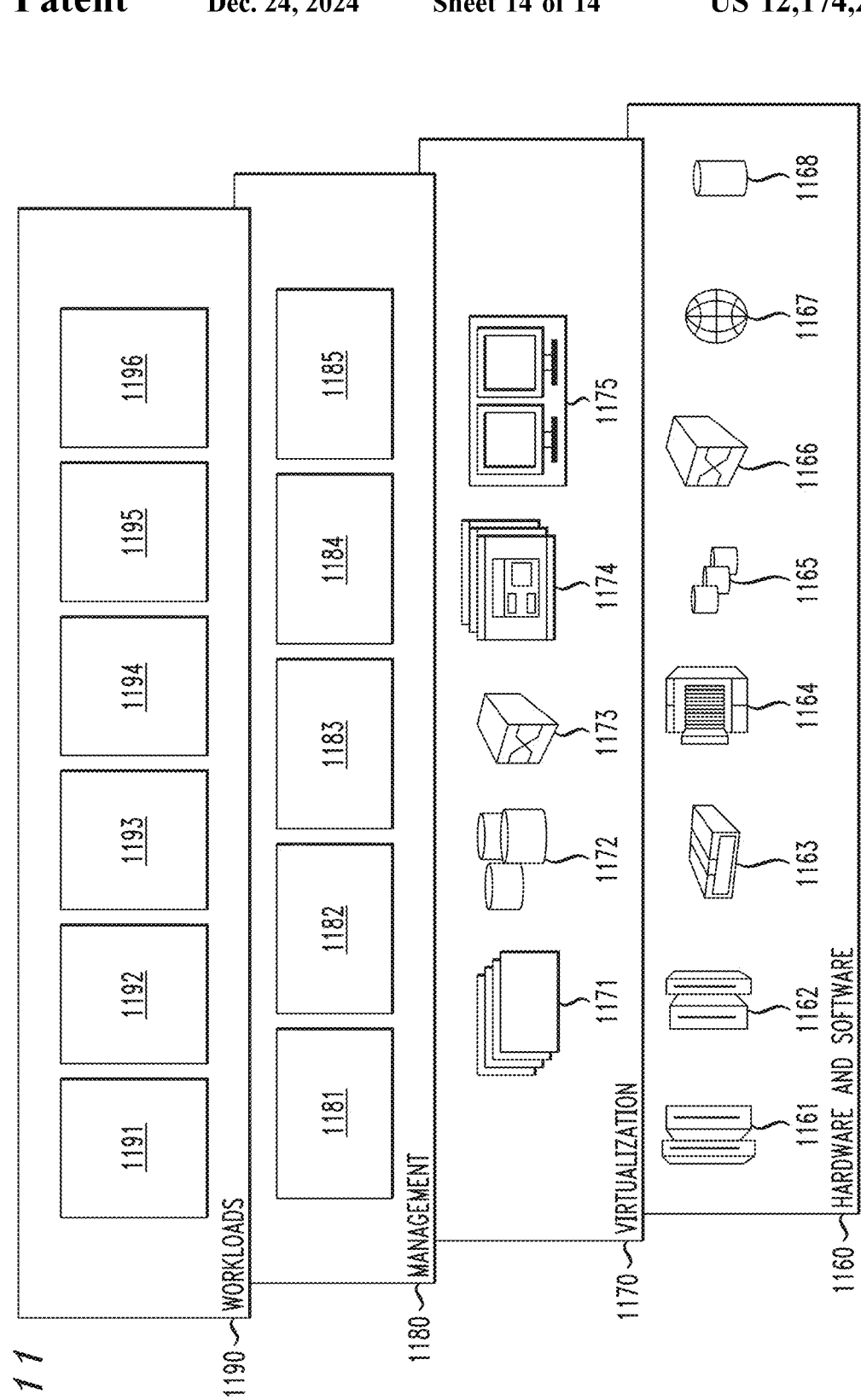
FIG. 11 depicts abstraction model layers according to an illustrative embodiment.

Referring now to FIG. 11, a set of functional abstraction layers provided by cloud computing environment 1050 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 1160 includes hardware and software components. Examples of hardware components include: mainframes 1161; RISC (Reduced Instruction Set Computer) architecture-based servers 1162; servers 1163; blade servers 1164; storage devices 1165; and networks and networking components 1166. In some embodiments, software components include network application server software 1167 and database software 1168.

Virtualization layer 1170 provides an abstraction layer from which the following examples of virtual entities may be provided: virtual servers 1171; virtual storage 1172; virtual networks 1173, including virtual private networks; virtual applications and operating systems 1174; and virtual clients 1175. In one example, management layer 1180 may provide the functions described below. Resource provisioning 1181 provides dynamic procurement of computing resources and other resources that are utilized to perform tasks within the cloud computing environment. Metering and Pricing 1182 provide cost tracking as resources are utilized within the cloud computing environment, and billing or invoicing for consumption of these resources.

In one example, these resources may include application software licenses. Security provides identity verification for cloud consumers and tasks, as well as protection for data and other resources. User portal 1183 provides access to the cloud computing environment for consumers and system administrators. Service level management 1184 provides cloud computing resource allocation and management such that required service levels are met. Service Level Agreement (SLA) planning and fulfillment 1185 provide pre-arrangement for, and procurement of, cloud computing resources for which a future requirement is anticipated in accordance with an SLA.

Workloads layer 1190 provides examples of functionality for which the cloud computing environment may be utilized. Examples of workloads and functions which may be provided from this layer include: mapping and navigation 1191; software development and lifecycle management 1192; virtual classroom education delivery 1193; data analytics processing 1194; transaction processing 1195; and testing system environment processing 1196, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a plurality of regions, wherein ones of the plurality of regions are partitioned from others of the plurality of regions and at least one of the plurality of regions is a region under test;
   at least one noise generator configured to generate noise in at least the region under test, wherein the noise comprises at least one or more rapid power supply load changes, wherein the noise causes one or more effects in the region under test, and wherein the noise is adjustable through a point of failure;
   at least one noise monitor configured to monitor one or more effects of the noise generated in the region under test; and
   a test controller configured to:
   cause the at least one noise generator to apply a test to the region under test, wherein the test comprises generating the noise in at least the region under test;
   receive information from the at least one noise monitor indicative of the one or more effects of the noise generated in the region under test as a result of the test;
   determine one or more conditions based on at least a portion of the information received from the at least one noise monitor;
   log the received information as data comprising one or more noise measurements, test pass information and test fail information;
   communicate with one or more other corresponding test controllers in one or more other corresponding systems to compare system-to-system conditions, wherein the one or more other corresponding test controllers are configured to function at least similarly to the test controller, wherein the one or more other corresponding systems are configured at least similarly to the system, and wherein the communication between the test controller and the one or more other corresponding test controllers is via at least one of a direct connection and a signal connection; and
   characterize the system with one or more performance characteristics based on comparing one or more system conditions and the logged data to an expected range of one or more results, the one or more performance characteristics comprising at least one of analog data perturbations and parametric data perturbations.

2. The system of claim 1, wherein the at least one noise monitor is located one of: external to the plurality of regions; internal to the region under test; and internal to one of the plurality of regions other than the region under test.

3. The system of claim 1, wherein at least one of the plurality of regions other than the region under test comprises the at least one noise generator.

4. The system of claim 1, wherein the test controller is located remote from the plurality of regions, the at least one noise generator and the at least one noise monitor.

5. The system of claim 1, wherein the noise generated by the at least one noise generator is repeatable.

6. The system of claim 1, wherein the noise generated by the at least one noise generator causes at least one of thermal stress and power supply load change in the region under test.

7. The system of claim 1, wherein the one or more conditions determined by the test controller based on at least a portion of the information received from the at least one noise monitor comprises one or more problems in at least one of a design feature of the region under test and an operation of the region under test.

8. The system of claim 1, wherein one or more of the plurality of regions is configured to function as a region under test in one test scenario and as a noise generator in another test scenario.

9. The system of claim 1, wherein the information received by the test controller from the at least one noise monitor indicative of the one or more effects of the noise generated in the region under test comprises data indicative of perturbations in the region under test due to the noise generated by the at least one noise generator.

10. The system of claim 1, wherein the system comprises an integrated circuit device and each of the plurality of regions comprises a functionally discrete circuit that collectively comprise the integrated circuit device.

11. The system of claim 1, wherein the at least one noise generator comprises built-in self-test functionality configured to generate the noise.

12. The system of claim 1, wherein the at least one noise monitor is further configured to monitor at least one of a skew metric and a jitter metric associated with a timing of one or more signals generated by the region under test.

13. A system, comprising:
a plurality of functionally discrete circuits, wherein at least a subset of the plurality of functionally discrete circuits are configurable to function as: a circuit under test;
at least one noise generator configured to generate noise in at least the circuit under test, wherein the noise comprises at least one or more rapid power supply load changes, wherein the noise causes one or more effects in the circuit under test, and wherein the noise is adjustable through a point of failure; and at least one noise monitor configured to monitor one or more effects of the noise generated in the circuit under test; and
a test controller operatively coupled to the plurality of functionally discrete circuits and configured to:
cause the at least one noise generator to apply a test to the circuit under test, wherein the test comprises generating the noise in at least the circuit under test;
receive information from the at least one noise monitor indicative of the one or more effects of the noise generated in the circuit under test as a result of the test;
determine one or more problems in at least one of a design feature and an operation of the circuit under test based on at least a portion of the information received from the at least one noise monitor;
log the received information as data comprising one or more noise measurements, test pass information and test fail information;
communicate with one or more other corresponding test controllers in one or more other corresponding systems to compare system-to-system conditions, wherein the one or more other corresponding test controllers are configured to function at least similarly to the test controller, wherein the one or more other corresponding systems are configured at least similarly to the system, and wherein the communication between the test controller and the one or more other corresponding test controllers is via at least one of a direct connection and a signal connection; and
characterize the system with one or more performance characteristics based on comparing one or more system conditions and the logged data to an expected range of one or more results, the one or more performance characteristics comprising at least one of analog data perturbations and parametric data perturbations.

14. The system of claim 13, wherein the at least one noise monitor is located one of: external to the plurality of functionally discrete circuits; internal to the circuit under test; and internal to one of the plurality of functionally discrete circuits other than the circuit under test.

15. The system of claim 13, wherein at least one of the plurality of functionally discrete circuits other than the circuit under test comprises the at least one noise generator.

16. The system of claim 13, wherein the noise generated by the at least one noise generator causes at least one of thermal stress and power supply load change in the circuit under test.

17. The system of claim 13, wherein the information received by the test controller from the at least one noise monitor indicative of the one or more effects of the noise generated in the circuit under test comprises data indicative of perturbations in the circuit under test due to the noise generated by the at least one noise generator.

18. A method, comprising:
designating, by a test controller for a first test scenario, at least one region under test from a plurality of regions of a system, wherein ones of the plurality of regions are partitioned from others of the plurality of regions;
causing, by the test controller, application of a test to the region under test, wherein the test comprises generation of noise in at least the region under test by at least one noise generator, wherein the noise comprises at least one or more rapid power supply load changes, wherein the noise causes one or more effects in the region under test, and wherein the noise is adjustable through a point of failure;
receiving, at the test controller, information from at least one noise monitor indicative of one or more effects of the noise generated in the region under test as a result of the test;
determining, at the test controller, one or more conditions for the first test scenario based on at least a portion of the information received from the at least one noise monitor;
logging, at the test controller, the received information as data comprising one or more noise measurements, test pass information and test fail information;
communicating, using the test controller, with one or more other corresponding test controllers in one or more other corresponding systems to compare system-to-system conditions, wherein the one or more other corresponding test controllers are configured to function at least similarly to the test controller, wherein the one or more other corresponding systems are configured at least similarly to the system, and wherein the communication between the test controller and the one or more other corresponding test controllers is via at least one of a direct connection and a signal connection; and
characterizing the system, at the test controller, with one or more performance characteristics based on comparing one or more system conditions and the logged data to an expected range of one or more results, the one or more performance characteristics comprising at least one of analog data perturbations and parametric data perturbations.

19. The method of claim 18, further comprising the test controller designating a different region of the plurality of regions as a region under test for a second test scenario, and iterating the noise generation causing, information receiving, and conditions determining steps for the second test scenario.

20. The method of claim 19, further comprising the test controller, after the first test scenario, causing an adjustment of the noise generated by the at least one noise generator for the second test scenario.

* * * * *